US006553560B2

(12) United States Patent
Ma et al.

(10) Patent No.: US 6,553,560 B2
(45) Date of Patent: Apr. 22, 2003

(54) ALLEVIATING LINE END SHORTENING IN TRANSISTOR ENDCAPS BY EXTENDING PHASE SHIFTERS

(75) Inventors: Melody W. Ma, San Jose, CA (US); Hua-Yu Liu, Palo Alto, CA (US)

(73) Assignee: Numerical Technologies, Inc., San Jose, CA (US)

( * ) Notice: Subject to any disclaimer, the term of this patent is extended or adjusted under 35 U.S.C. 154(b) by 0 days.

(21) Appl. No.: 09/872,620

(22) Filed: May 31, 2001

(65) Prior Publication Data

US 2002/0144232 A1 Oct. 3, 2002

Related U.S. Application Data

(60) Provisional application No. 60/281,325, filed on Apr. 3, 2001.

(51) Int. Cl.⁷ .............................................. G06F 17/50
(52) U.S. Cl. ............................... 716/19; 716/21; 430/5
(58) Field of Search .......................... 716/19–21; 430/5, 430/30

(56) References Cited

U.S. PATENT DOCUMENTS

| | | | |
|---|---|---|---|
| 4,456,371 A | 6/1984 | Lin | 355/71 |
| 5,302,477 A | 4/1994 | Dao, et al. | 430/5 |
| 5,308,741 A | 5/1994 | Kemp | 430/312 |
| 5,316,878 A | 5/1994 | Saito et al. | 430/5 |
| 5,324,600 A | 6/1994 | Jinbo et al | 430/5 |
| 5,328,807 A | 7/1994 | Tanaka et al. | 430/311 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,472,814 A | 12/1995 | Lin | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |

(List continued on next page.)

FOREIGN PATENT DOCUMENTS

| | | |
|---|---|---|
| DE | 195 45 163 A1 | 6/1996 |
| EP | 0 653 679 A2 | 5/1995 |
| EP | 0 698 821 | 2/1996 |

(List continued on next page.)

OTHER PUBLICATIONS

Wang, R., et al., "Plarized Phase Shift Mask: Concept, Design and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

(List continued on next page.)

Primary Examiner—Matthew Smith
Assistant Examiner—Paul Dinh
(74) Attorney, Agent, or Firm—Park, Vaughan & Fleming LLP

(57) ABSTRACT

One embodiment of the invention provides a system and a method for reducing line end shortening during an optical lithography process for manufacturing an integrated circuit. The system operates by receiving a specification of the integrated circuit, wherein the specification defines transistors that include gates. Next, the system identifies a gate within the specification, wherein the gate includes an endcap that is susceptible to line end shortening during the optical lithography process. The system then extends a phase shifter used to form the gate, so that the phase shifter defines at least a portion of the endcap and thereby reduces line end shortening of the endcap due to optical effects.

56 Claims, 6 Drawing Sheets

U.S. PATENT DOCUMENTS

| | | | | |
|---|---|---|---|---|
| 5,635,316 | A | 6/1997 | Dao | 430/5 |
| 5,636,131 | A | 6/1997 | Liebmann et al. | 364/490 |
| 5,702,848 | A | 12/1997 | Spence | 430/5 |
| 5,725,969 | A | 3/1998 | Lee | 430/5 |
| 5,761,075 | A | 6/1998 | Oi et al. | 364/488 |
| 5,766,804 | A | 6/1998 | Spence | 430/5 |
| 5,766,806 | A | 6/1998 | Spence | 430/5 |
| 5,807,649 | A | 9/1998 | Liebmann et al. | 430/5 |
| 5,827,623 | A | 10/1998 | Ishida et al. | 430/5 |
| 5,858,580 | A | 1/1999 | Wang et al. | 430/5 |
| 5,885,734 | A | 3/1999 | Pierrat et al. | 430/5 |
| 5,923,562 | A | 7/1999 | Liebmann et al. | 364/488 |
| 5,923,566 | A | 7/1999 | Galan et al. | 364/489 |
| 5,994,002 | A | 11/1999 | Matsuoka | 430/5 |
| 5,998,068 | A | 12/1999 | Matsuoka | 430/5 |
| 6,004,702 | A | 12/1999 | Lin | 430/5 |
| 6,010,807 | A | 1/2000 | Lin | 430/5 |
| 6,057,063 | A | 5/2000 | Liebmann et al. | 430/5 |
| 6,066,180 | A | 5/2000 | Kim et al. | 716/19 |
| 6,083,275 | A | 7/2000 | Heng et al. | 716/19 |
| 6,130,012 | A | 10/2000 | May et al. | 430/5 |
| 6,139,994 | A | 10/2000 | Broeke et al. | 430/5 |
| 6,185,727 | B1 | 2/2001 | Liebman | 716/19 |
| 6,228,539 | B1 | 5/2001 | Wang et al. | 430/5 |
| 6,251,549 | B1 | 6/2001 | Levenson | 430/11 |
| 6,258,493 | B1 | 7/2001 | Wang et al. | 430/5 |
| 6,335,128 | B1 * | 1/2002 | Cobb et al. | 430/5 |
| 6,338,922 | B1 | 1/2002 | Liebmann et al. | 430/5 |
| 6,370,679 | B1 * | 4/2002 | Chang et al. | 716/19 |
| 6,420,074 | B2 | 7/2002 | Wang et al. | 430/5 |
| 6,430,737 | B1 * | 8/2002 | Cobb et al. | 716/19 |
| 6,436,590 | B2 * | 8/2002 | Wang et al. | 430/5 |
| 6,470,489 | B1 * | 10/2002 | Chang et al. | 716/21 |
| 2001/0000240 | A1 | 4/2001 | Wang et al. | 430/5 |
| 2001/0028985 | A1 | 10/2001 | Wang et al. | 430/5 |
| 2002/0083410 | A1 | 6/2002 | Wu et al. | 716/19 |
| 2002/0127479 | A1 | 9/2002 | Pierrat | 430/5 |
| 2002/0129327 | A1 | 9/2002 | Pierrat et al. | 716/19 |
| 2002/0136964 | A1 | 9/2002 | Pierrat | 430/5 |
| 2002/0142231 | A1 | 10/2002 | Kling et al. | 430/5 |
| 2002/0142232 | A1 | 10/2002 | Kling et al. | 430/5 |
| 2002/0144232 | A1 | 10/2002 | Ma et al. | 716/19 |
| 2002/0152454 | A1 | 10/2002 | Cote et al. | 716/21 |
| 2002/0155363 | A1 | 10/2002 | Cote et al. | 430/5 |

FOREIGN PATENT DOCUMENTS

| | | |
|---|---|---|
| GB | 2333613 A | 7/1999 |
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Techologies AG (12 pages).

Wong, A., et al., "Polarization Effects in Mask Transmission", University of California Berkley (8 pages).

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

Nitayama, A., et al., "New Phase Shifting with self–Aligned Phase Sifters for a Quarte Micron Photolithography", IEDM, pp. 3.3.1–3.3.4, Dec 3–6, 1989.

Yamanaka, T., et al., "A 5.9um2 Super Low Power SRAM Cell Using a New Phase–Shift Lithography", IEDM, pp. 18.3.1–18.3.4 (1990).

Hirai, Y., et al., "Automatic Pattern Generation System for Phase Shifting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Jornal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Burggraaf, P., "Lithography's Leading Edge, Part 1: Phase–Shift Technology and Part 2: I–Line and Beyond", Semiconductor International, pp. 43–47 and 52–56, Feb. 1992.

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Moniwa, A., et al., "Algorithm for Phase–Shift Mask Design with Priority on Shifter Placement", Jpn. J. Appl. Phys., vol. 32. Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for Phase–Shift Mask", J. Vac. Sci. Technol. B. vol. 11, No. 6, pp. 2665–2668, Nov./Dec. 1993.

Ronse, K., et al., "Comparison of Various Phase Shift Strategies and Application to 0.35um ASIC Designs", SPIE—Optical/Laser Microlithography VI, vol. 1927, pp. 2–16 (1993).

Waas, T., et al., "Automatic Generation of Phase Shift Mask Layouts", Microelectronic Engineering, vol. 23, pp. 139–142 (1994).

Moniwa, A., et al., "Heuristic Method for Phase–Confict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Patten Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1955.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Nakae, A., et al., "A Proprosal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Ohnuma, H., et al., "Lithography Computer Aided Design Technology for Embedded Memory in Logic", Jpn. J. Appl. Phys., vol. 37, Part 1, No. 12B, pp. 6686–6688, Dec. 1998.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Pierrat, C., "Investigation of Proximity Effects in Alternating Aperture Phase Shifting Masks", Numerical Technologies, Inc. (11 pages).

Kikuchi, K., et al., "Method of Expanding Process Window for the Double Exposure Technique with alt–PSMs", Optical Microlithography XIII, Proceeding of SPIE, vol. 4000, pp. 121–131 (2000).

Cote, M., et al., "A Practical Application of Full–Feature Alternating Phase–Shifting Technology for a Phase–Aware Standard–Cell Design Flow", Numerical Technologies Inc. (6 pages).

Heng, F., et al. "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

Ackmann, P. et al., "Phase Shifting And Optical Proximity Corrections To Improve CD Control On Logic Devices In Manufacturing For Sub 0.35 $\mu$m I–Line", Advance Micro Devices (8 pages).

Asai, S. et al., "High Performance Optical Lithography Using A Separated Light Source", J. Vac. Sci. Technol . B, vol. 10, No. 6, pp. 3023–3026, Nov./Dec. 1992.

Barouch, E. et al., "OPTIMASK: An OPC Algorithm For Chrome And Phase–Shift Mask Design", SPIE, vol. 2440, pp. 192–206, Feb. 1995.

Brunner, T. et al., "170nm Gates Fabricated By Phase–Shift Mask And Top Anti–Reflector Process", SPIE, Optical/Laser Microlithography VI, vol. 1927, pp. 182–189 (1993).

Brunner, T., "Rim Phase–Shift Mask Conbined With Off–Axis Illumination: A Path to 0.5$\lambda$/Numerical Aperture Geometries", Optical Engineering, vol. 32, No, 10, pp. 2337–2343, Oct. 1993.

Fukuda, H. et al., "Determination Of High–Order Lens Aberration Using Phase/Amplitude Linear Algebra", J. Vac. Sci. Technol. B, vol. 17, No. 6, pp. 3318–3321, Nov./Dec. 1999.

Galan, G. et al., "Application Of Alternating–Type Phase Mask To Polysilicon Level For Random Logic Circuits", Jpn. J. Appl. Phys., vol. 33, pp. 6779–6784 (1994).

Inokuchi, K. et al., "Sub–Quarter Micron Gate Fabrication Process Using Phase–Shifting–Mask For Microwave GaAs Devices", Extended Abstracts of the 1991 Intl. Conference on Solid State Devices and Materials, Yokohama, Japan, pp. 92–94 (1991).

Inokuchi, K. et al., "Sub–Quarter–Micron Gate Fabrication Process Using Phase–Shifting Mask For Microwave GaAs Devices", Japanese Journal of Applied Physics, vol. 30, No. 12B, pp. 3818–3821, Dec. 1991.

Ishiwata, N. et al., "Novel Alternating Phase Shift Mask With Improved Phase Accuracy", SPIE, Proceeding of the 17th Annual Symposium on Photomask Technology and Management, vol. 3236, pp. 243–249 (1997).

Jinbo, H. et al., "0.2 $\mu$m Or Less i–Line Lithography By Phase–Shifting–Mask Technology", IEEE, pp. 33.3.1–33.3.4 (1990).

Jinbo, H. et al., "Application Of Blind Method To Phase–Shifting Lithography", IEEE, 1992 Symposium on VLSI Technology Digest of Technical Papers, pp. 112–113 (1992).

Fukuda, H., "Node–Connection/Quantum Phase–Shifting Mask: Path To Below 0.3 $\mu$m Pitch, Proximity Effect Free, Random Interconnects And Memory Patterning", J. Vac. Sci. Technol. B, vol. 17, No. 6, pp. 3291–3295, Nov./Dec. 1999.

Jinbo, H. et al., "Improvement Of Phase–Shifter Edge Line Mask Method", Japanese Journal of Applied Physics, vol. 30, No. 11B, pp. 2998–3003, Nov. 1991.

Karklin, L., "A Comprehensive Simulation Study Of The Photomask Defects Printability", *SPIE*, vol. 2621, pp. 490–504 (1995).

Kimura, T. et al., "Subhalf–Micron Gate GaAs Mesfet Process Edge Using Phase Shifting–Mask Technology", *IEEE*, GaAs IC Symposium, pp. 281–284 (1991).

Levenson, M. et al., "Improving Resolution In Photolithography With A Phase–Shifting Mask", *IEEE* Transactions on Electron Devices, vol. ED–29, No. 12, , pp. 1828–1836, Dec. 1982.

Lin, B.J., "Phase–Shifting Masks Gain An Edge", *IEEE* Circuits & Devices, pp. 28–35, Mar. 1993.

Liu, H.Y. et al., "Fabrication of 0.1 μm T–Shaped Gates By Phase–Shifting Optical Lithography", *SPIE*, Optical/Laser Microlithography VI, vol. 1927, pp. 42–52 (1993).

Mizuno, F. et al., "Practical Phase–Shifting Mask Technology For 0.3 μm Large Scale Integrations", *J. Vac. Sci. Technol. B*, vol. 12, No. 6, pp. 3799–3803. Nov./Dec. 1994.

Morimoto, H. et al., "Next Generation Mask Strategy— Technologies Are Ready For Mass Production Of 256MDRAM?", *SPIE*, vol. 3236, pp. 188–189 (1997).

Neureuther, A., "Modeling Phase Shifting Masks", *SPIE*, 10$^{th}$ Annual Symposium on Microlithography, vol. 1496, pp. 80–85 (1990).

Nistler, J. et al., "Large Area Optical Design Rule Checker For Logic PSM Application", *SPIE*, Photomask and X–Ray Mask Technology, Vol. 2254, pp. 78–92 (1994).

Nistler, J. et al. "Phase Shift Mask Defect Printability Analysis", Proceedings of the Microlithography Seminar INTERFACE '93, OCG Microelectronic Materials, Inc., pp. 11–28 (1993).

Ohtsuka, H. et al., "Phase Defect Repair Method For Alternating Phase Shift Masks Conjugate Twin–Shifter Method", *Jpn. J. Appl. Phys.*, vol. 315, pp. 4143–4149 (1992).

Matsuoka, K. et. al., "Application Of Alternating Phase–Shifting Mask To 0.16 μm CMOS Gate Patterns", Matsushita Electric Ind. Co., Ltd. (9 pages).

Pati, Y.C. et al., "Phase–Shifting Masks For Microlithography: Automated Design And Mask Requirements", *J. Opt. Soc. Am.*, vol. 11, No. 9, pp. 2438–2452, Sep. 1994.

Pierrat, C. et al., "A Rule–Based Approach To E–Beam And Process–Induced Proximity Effect Correction For Phase–Shifting Mask Fabrication", *SPIE*, vol. 2194, pp. 298–308 (1994).

Pierrat, C, et al., "Phase–Shifting Mask Topography Effects On Lithographic Image Quality", *IEEE*, pp. 3.3.1–3.3.4 (1992).

Rieger, M. et al., "System For Lithography Proximity Compensation", Precim Company, Portland, Oregon, Sep. 1993 (28 pages).

Roman, B. et al., "Implications Of Device Proceeding On Photomask CD Requirements", *SPIE*, vol. 3236 (1997) (Abstract Only).

Spence, C. et al., "Auto Determination Of CAD Layout Failures Through Focus: Experiment And Simulation", *SPIE*, vol. 2197, pp. 302–313 (1994).

Spence, C. et al., "Detection Of 60° Phase Defects On Alternating PSMs", Advance Micro Devices, KLA–Rencor, DuPont RTC (2 pages).

Spence, C. et al., "Integration Of Optical Proximity Correction Strategies In Strong Phase Shifters Design For Poly–Gate Layers", *Bacus News*, vol. 15, Issue 12, pp. 1, 4–13, Dec. 1999.

Stirniman, J. et al., "Wafer Proximity Correction And Its Impact On Mask–Making", *Bacus News*, vol. 10, Issue 1, pp. 1, 3–7, 10–12, Jan. 1994.

Sugawara, M. et al., "Defect Printability Study Of Attenuated Phase–Shifting Masks For Specifying Inspection Sensitivity", Semiconductor Company, Sony Corporation, Kanagawa, Japan (16 pages).

Terasawa, T. et al., "0.3–Micron Optical Lithography Using A Phase–Shifting Mask", *SPIE*, Optical/Laser Microlithography II, vol. 1088, pp. 25–33, Mar. 1989.

Watanabe, H. et al., "Detection And Printability Of Shifter Defects In Phase–Shifting Masks II Defocus Characteristics", *Jpn. J. Appl. Phys.*, vol. 31, pp. 4155–4160 (1992).

Wiley, J. et al., "Phase Shift Mask Pattern Accuracy Requirements And Inspection Technology", *SPIE*, Integrated Circuit Metrology, Inspection, and Process Control V, vol. 1464, pp. 346–355 (1991).

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Stimulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

* cited by examiner

DESIGN

PRINTED
IMAGE

LINE END SHORTENING AND PULLBACK

ALLEVIATING LINE END SHORTENING IN TRANSISTOR ENDCAPS BY EXTENDING PHASE SHIFTERS

RELATED APPLICATION

This application hereby claims priority under 35 U.S.C. § 119 to U.S. Provisional Patent Application No. 60/281,325 filed Apr. 3, 2001.

BACKGROUND

1. Field of the Invention

The invention relates to the process of fabricating semiconductor chips. More specifically, the invention relates to a method and an apparatus that extends phase shifters to alleviate line end shortening and provide better gate critical dimension control during an optical lithography process for manufacturing an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and light-transmissive clear regions (chromeless), which are generally formed of quartz, is then positioned over this photoresist coated wafer. (Note that the term "mask" as used in this specification is meant to include the term "retical.") Light is then shone on the mask from a visible light source or an ultraviolet light source.

This light is generally reduced and focused through an optical system that contains a number of lenses, filters and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

One problem that arises during the optical lithography process is "line end shortening" and "pullback" caused by optical effects. For example, the upper portion of FIG. 1 illustrates a design of a transistor with a polysilicon line 102, running from left to right, that forms a gate region used to electrically couple an upper diffusion region with a lower diffusion region. The lower portion of FIG. 1 illustrates the actual printed image that results from the design.

Note that because of optical effects and resist pullback there is a significant amount of line end shortening. This line end shortening is due to optical effects that cause the light to expose more of the resist under a line end than under other portions of the line.

Note that polysilicon line 102 has been narrowed using optical phase shifting in order to improve the performance of the transistor by reducing the resistance through the gate region. Phase shifters are often incorporated into a mask in order to achieve line widths that are smaller than the wavelength of the light that is used to expose the photoresist layer through the mask. During phase shifting, the destructive interference caused by two adjacent clear areas on a mask is used to create an unexposed area on the photoresist layer. This is accomplished by exploiting the fact that light passing through a mask's clear regions exhibits a wave characteristic having a phase that is a function of the distance the light travels through the mask material. By placing two clear areas adjacent to each other on the mask, one of thickness $t_1$ and the other of thickness $t_2$, one can obtain a desired unexposed area on the underlying photoresist layer caused by interference. By varying the thickness $t_1$ and $t_2$ appropriately, the light exiting the material of thickness $t_2$ is 180 degrees out of phase with the light exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999, which is hereby incorporated by reference.

In order to compensate for line end shortening, designers often add optical proximity correction (OPC) features, such as "hammer heads," onto line ends. For example, in FIG. 2A, a hammerhead 215 is added onto an endcap 216 of a transistor in order to reduce the problem of line end shortening in some situations. However, note that hammerhead 215 may give rise the design rule violations that can potentially cause bridging between the hammerhead and polysilicon line 202.

This bridging problem can be alleviated by introducing a separation between hammerhead 215 and polysilicon line 202. However, introducing such a separation increases the size of the circuit element, which means that fewer circuit elements can be integrated into a semiconductor chip.

What is needed is a method and an apparatus for mitigating the line end shortening problem in transistor endcaps, while reducing the impact of OPC features, such as hammerheads.

SUMMARY

One embodiment of the invention provides a system and a method for reducing line end shortening and improved gate critical dimension control during an optical lithography process for manufacturing an integrated circuit. The system operates by receiving a specification of the integrated circuit, wherein the specification defines transistors that include gates. Next, the system identifies a gate within the specification, wherein the gate includes an endcap that is susceptible to line end shortening during the optical lithography process. The system then extends a phase shifter used to form the gate, so that the phase shifter defines at least a portion of the endcap and thereby reduces line end shortening of the endcap due to optical effects.

In one embodiment of the invention, extending the phase shifter involves extending the phase shifter past the endcap.

In one embodiment of the invention, extending the phase shifter involves extending the phase shifter so that it covers at least part of the endcap, but does not extend past the endcap. In a variation on this embodiment, the phase shifter extends past the endcap.

In one embodiment of the invention, the system automatically checks design rules that specify a minimum distance between the phase shifter and other structures within the integrated circuit.

In one embodiment of the invention, the system additionally marks the endcap to prevent subsequent optical proximity correction (OPC) of the endcap. In a variation on this embodiment, the system subsequently applies OPC to the layout, without applying OPC to endcaps that have been marked.

In one embodiment of the invention, if the endcap has been modified through optical proximity correction (OPC), the system replaces the modified endcap with an (ideal) unmodified endcap.

In one embodiment of the invention, if the endcap is not straight, the system replaces the endcap with a straight endcap.

DETAILED DESCRIPTION

Extended Phase Shifter

Figure 1:
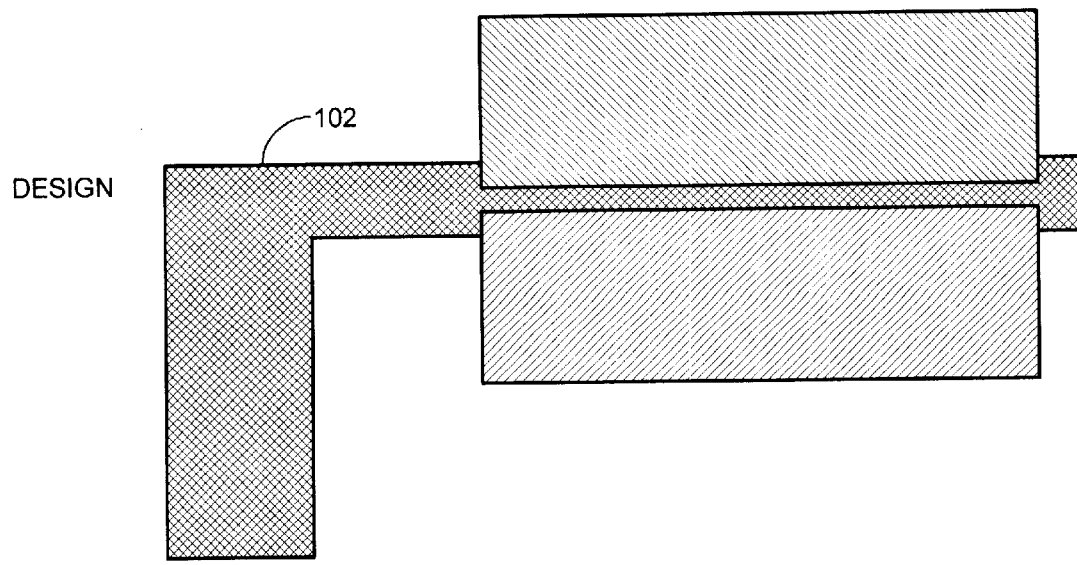
FIG. 1 illustrates the line end shortening problem.
Figure 1:
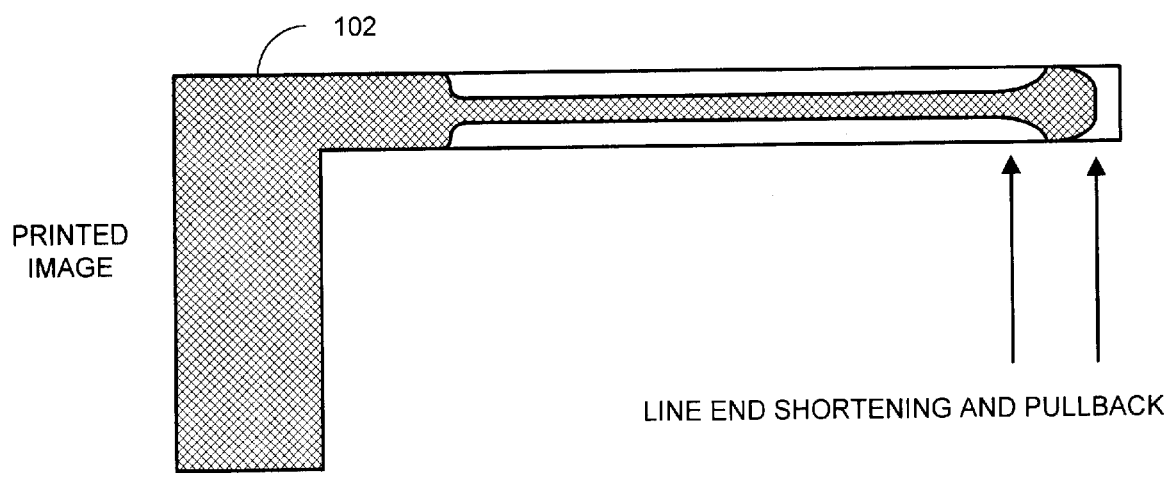
Figure 2A:
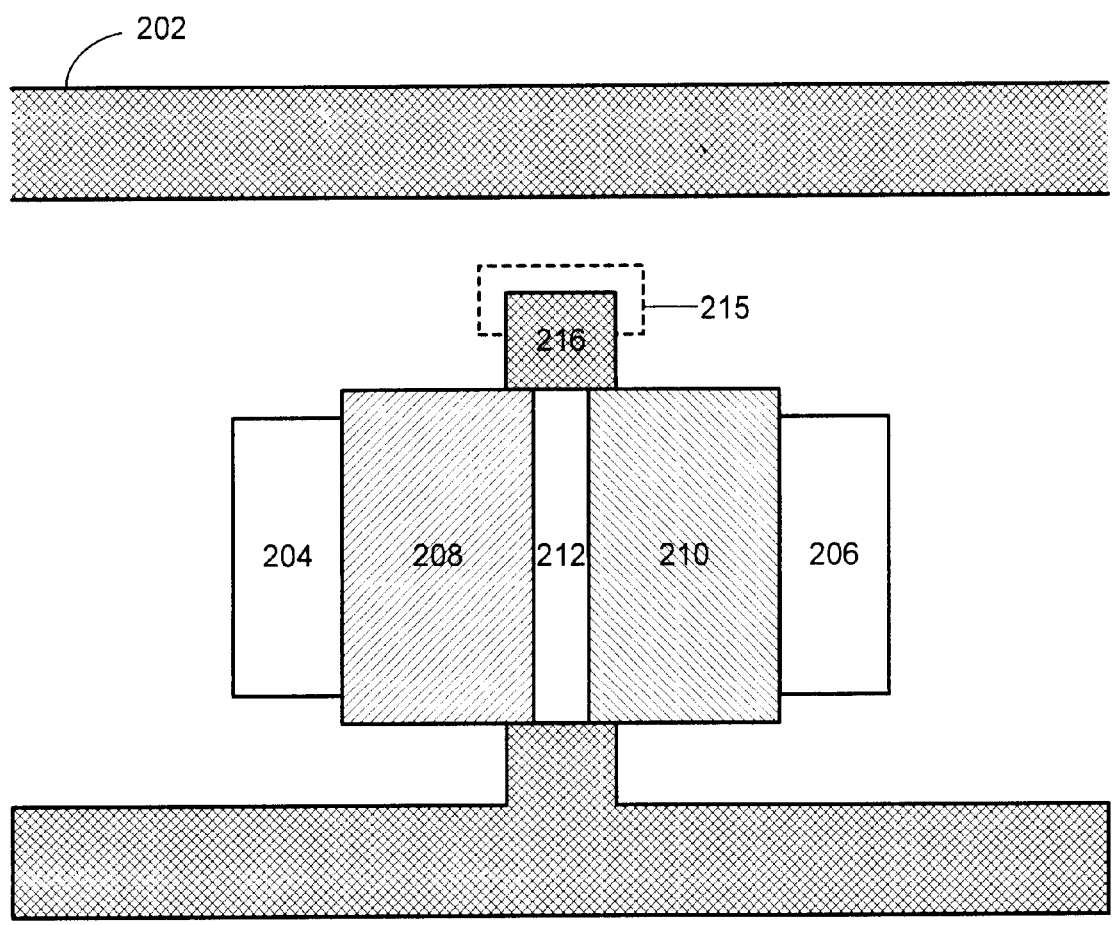
FIG. 2A illustrates the use of a hammerhead to compensate for the line end shortening problem.
Figure 2B:
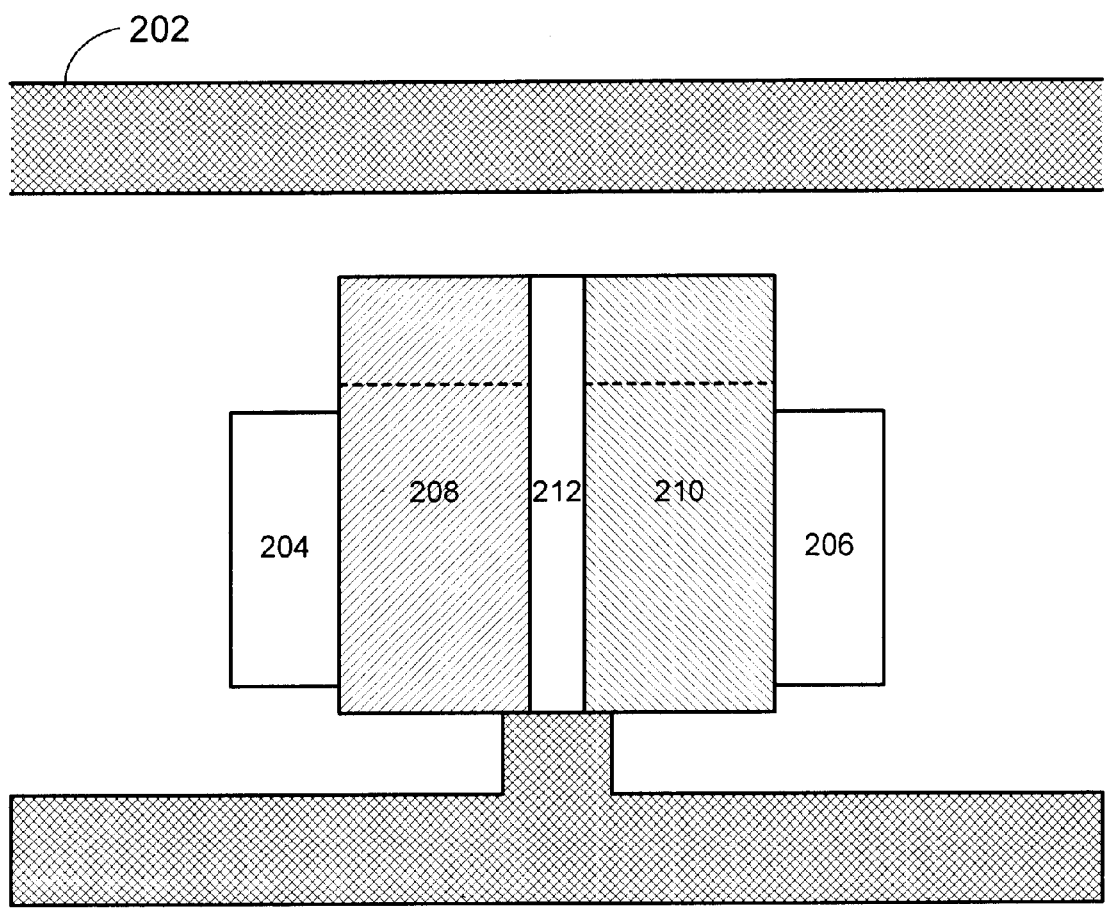
FIG. 2B illustrates the use of an extended phase shifter to alleviate the line end shortening problem in accordance with an embodiment of the invention.

FIG. 2B illustrates the use of an extended phase shifter to alleviate the line end shortening problem in accordance with an embodiment of the invention. The circuit layout in FIG. 2B is the same as the circuit layout FIG. 2A, except that the phase shifter comprised of, zero-degree clear region 208, chromium regulator 212 and 180-degree clear region 210, has been extended so that it covers at least part of endcap 216 (illustrated in FIG. 2A).

This alleviates the optical line end shortening problem for endcap 216 because the destructive interference of the phase shifter lessens the incidental exposure problem that causes the line end shortening around endcap 216.

Note that the phase shifter may extend past endcap 216 if the phase shifter does not interfere with other features in the circuit. Otherwise, the phase shifter may extend to cover at least part of endcap 216, but not past endcap 216, so that the phase shifter defines at least a portion of the boundary of endcap 216.

Note that by extending the phase shifter in this way, OPC features such as hammerhead 215 are no longer required. Hence, the potential design rule violations caused by these OPC features can be avoided.

Endcap Replacement

Figure 3:
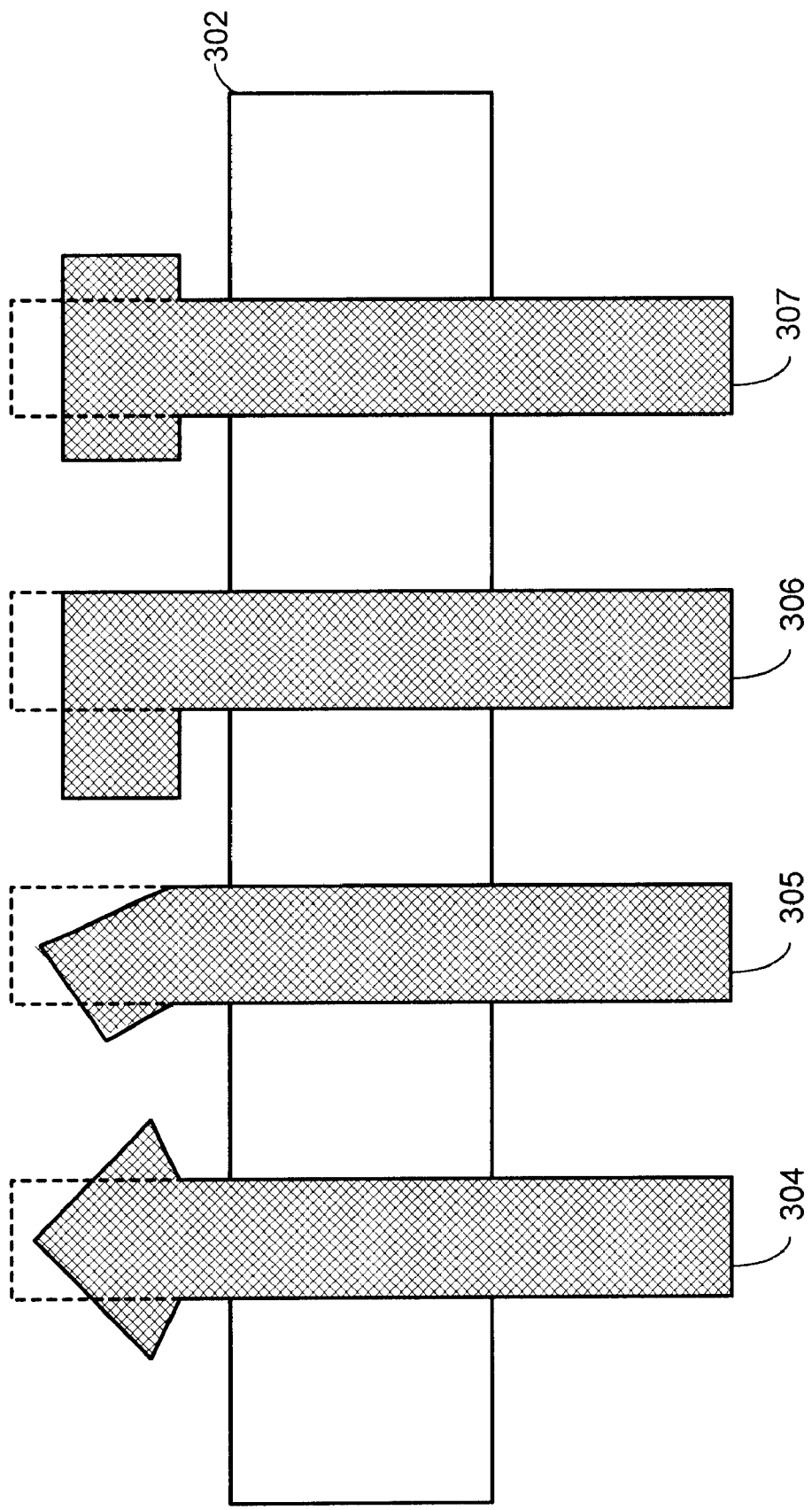
FIG. 3 illustrates the replacement of endcaps that are not straight or endcaps that have been modified with straight unmodified endcaps in accordance with an embodiment of the invention.

FIG. 3 illustrates the replacement of endcaps that are not straight or endcaps that have been modified with straight unmodified endcaps in accordance with an embodiment of the invention. In FIG. 3, a number of polysilicon lines 304–307 form a set of pass transistors in active diffusion region 302. Some of these polysilicon lines, such as polysilicon lines 304 and 307, have endcaps with OPC features that are become unnecessary if there exists an extended phase shifter. Other polysilicon lines, 305 and 306, are not straight.

When an extended phase shifter is used to form the endcaps in polysilicon lines 304–307, the OPC features and non-straight endcaps become unnecessary. Consequently, these endcaps are replaced by unmodified straight endcaps as is illustrated by the dotted lines in FIG. 3.

Wafer Fabrication Process

Figure 4:
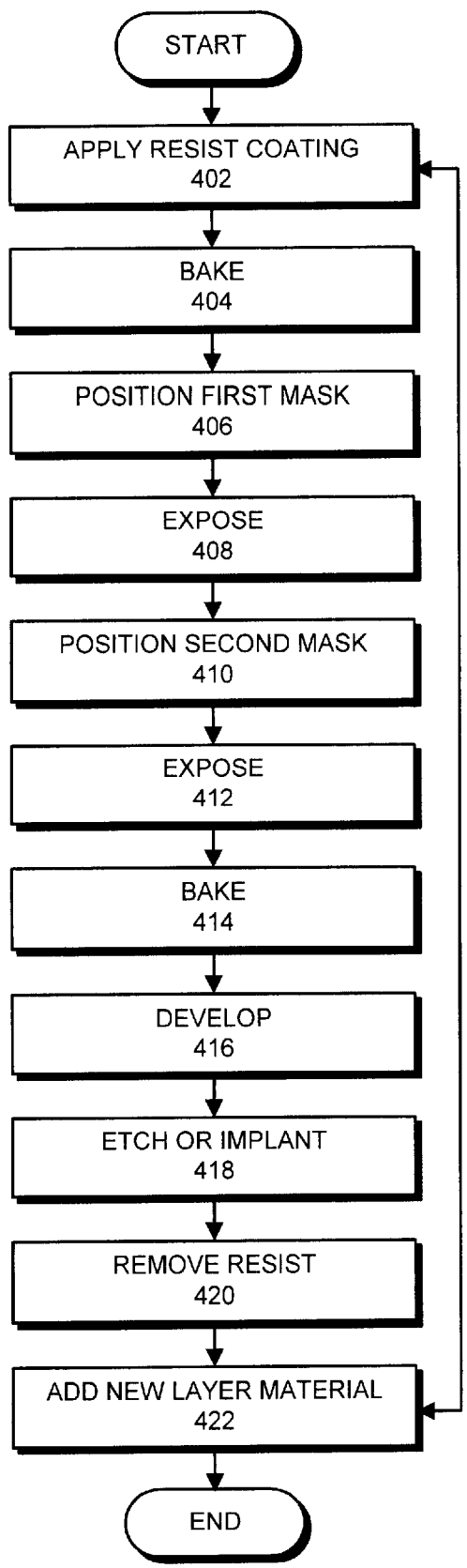
FIG. 4 is a flow chart illustrating the wafer fabrication process in accordance with an embodiment of the invention.

FIG. 4 is a flow chart illustrating the wafer fabrication process in accordance with an embodiment of the invention. The system starts by applying the resist coating to the top surface of a wafer (step 402). Next, the system bakes the resist layer (step 404). The system then positions the first mask over the photoresist layer (step 406), and then exposes the photoresist layer through the first mask (step 408). Next, the system positions the second mask over the photoresist layer (step 410), and then exposes the photoresist layer through the second mask (step 412). Note that the first mask and/or the second mask may include phase shifters.

The system then bakes the wafer again (step 414) before developing the photoresist layer (step 416). Next, either a chemical etching or ion implantation step takes place (step 418) before the photoresist layer is removed (step 420). Finally, a new layer of material can be added and the process can be repeated for the new layer (step 422).

Process of Extending a Phase Shifter

Figure 5:
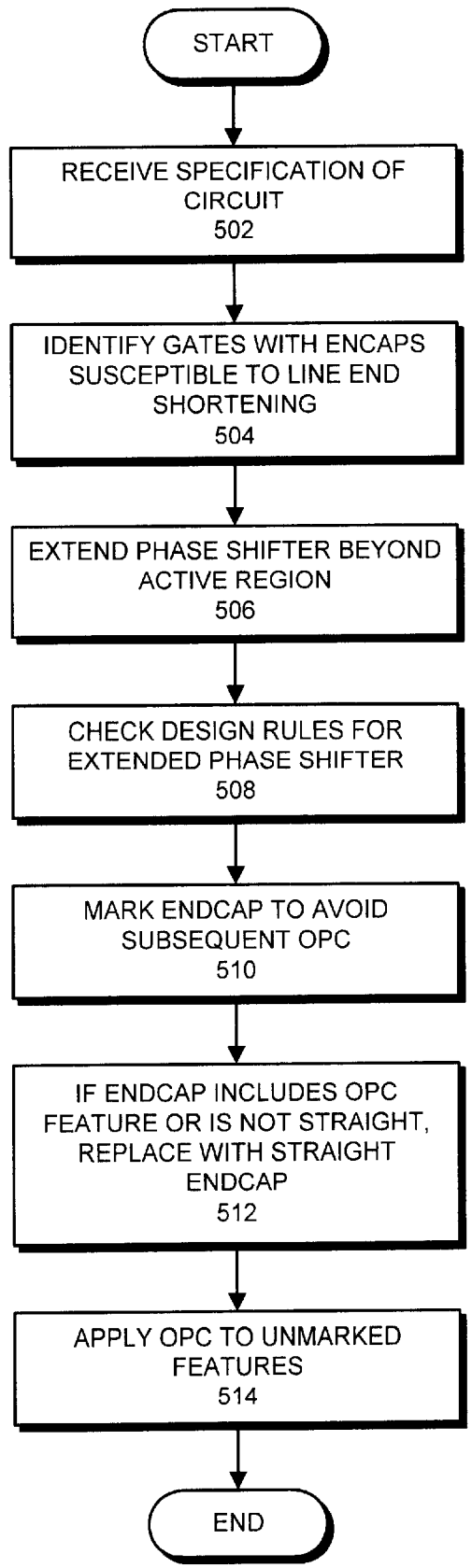
FIG. 5 is a flow chart illustrating the process of extending a phase shifter to alleviate the line end shortening problem for a transistor endcap in accordance with an embodiment of the invention.

FIG. 5 is a flow chart illustrating the process of extending a phase shifter to alleviate the line end shortening problem for a transistor endcap in accordance with an embodiment of the invention. The process starts when the system receives a specification of the circuit in some format, such as GDSII stream format (step 502). Next, the system identifies gates within transistors that have endcaps that the designer desires to apply phase shifting to, and that are susceptible to line end shortening problems (step 504).

For these identified gates, the system extends phase shifters beyond the active region, for example in FIG. 2B past active diffusion regions 204 and 206 (step 506). Note that this may involve extending the phase shifter beyond the endcap, which in some cases is preferable, or alternatively, extending the phase shifter to cover part or all of the endcap without extending beyond the endcap. Also note that in one embodiment of the invention, extended phase shifters can be inserted into areas that were not originally targeted for phase shifting in order to alleviate the line end shortening problem.

Next, the system checks design rules to ensure that there exists a prespecified minimum distance between the extended shifter and other polysilicon features in the circuit (step 508). If a design rule violation is detected, an error can be generated, and corrective action can be taken by either modifying the polysilicon feature or by modifying the extended shifter.

The system also marks the identified endcaps to ensure that the endcaps are not modified during a subsequent OPC process (step 510).

Additionally, if an identified endcap has been modified to include an OPC feature or if the endcap is not straight, the endcap can be replaced with a unmodified straight endcap as is illustrated in FIG. 3 (step 512).

Finally, an additional OPC process can be applied to unmarked features within the specification of the circuit (step 514).

The preceding description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for reducing line end shortening during an optical lithography process for manufacturing an integrated circuit, comprising:
   receiving a specification of the integrated circuit, wherein the specification defines transistors that include gates;
   identifying a gate within the specification, wherein the gate includes an endcap that is susceptible to line end shortening during the optical lithography process; and
   extending a phase shifter used to form the gate beyond an associated active region, so that the phase shifter defines at least a portion of the endcap and thereby reduces line end shortening of the endcap due to optical effects.

2. The method of claim 1, wherein extending the phase shifter involves extending the phase shifter past the endcap.

3. The method of claim 1, wherein extending the phase shifter involves extending the phase shifter so that it covers at least part of the endcap, but does not extend past the endcap.

4. The method of claim 1, further comprising automatically checking design rules that specify a minimum distance between the phase shifter and other structures within the integrated circuit.

5. The method of claim 1, further comprising marking the endcap to prevent subsequent optical proximity correction (OPC) of the endcap.

6. The method of claim 5, further comprising applying optical proximity correction (OPC) to the specification of the integrated circuit, wherein the OPC is not applied to endcaps that have been marked.

7. The method of claim 1, further comprising, if the endcap includes modifications for optical proximity correction (OPC), removing the modifications.

8. The method of claim 1, further comprising, if the endcap is not straight, replacing the endcap with a straight endcap.

9. A computer-readable storage medium storing instructions that when executed by a computer cause the computer to perform a method for reducing line end shortening during an optical lithography process for manufacturing an integrated circuit, the method comprising:
   receiving a specification of the integrated circuit, wherein the specification defines transistors that include gates;
   identifying a gate within the specification, wherein the gate includes an endcap that is susceptible to line end shortening during the optical lithography process; and
   extending a phase shifter used to form the gate beyond an associated active region, so that the phase shifter defines at least a portion of the endcap and thereby reduces line end shortening of the endcap due to optical effects.

10. The computer-readable storage medium of claim 9, wherein extending the phase shifter involves extending the phase shifter past the endcap.

11. The computer-readable storage medium of claim 9, wherein extending the phase shifter involves extending the phase shifter so that it covers at least part of the endcap, but does not extend past the endcap.

12. The computer-readable storage medium of claim 9, wherein the method further comprises automatically checking design rules that specify a minimum distance between the phase shifter and other structures within the integrated circuit.

13. The computer-readable storage medium of claim 9, wherein the method further comprises marking the endcap to prevent subsequent optical proximity correction (OPC) of the endcap.

14. The computer-readable storage medium of claim 13, wherein the method further comprises applying optical proximity correction (OPC) to the specification of the integrated circuit, wherein the OPC is not applied to endcaps that have been marked.

15. The computer-readable storage medium of claim 9, wherein the method further comprises removing the modifications to the endcap that were previously made for optical proximity correction (OPC).

16. The computer-readable storage medium of claim 9, wherein the method further comprises replacing the endcap with a straight endcap if the endcap is not straight.

17. A mask for use in fabricating an integrated circuit, wherein the mask includes a phase shifter that defines a gate, wherein the phase shifter extends into an endcap of an associated transistor to control line end shortening arising from optical effects, comprising:
   the phase shifter within the mask that is configured to create a region of destructive light interference on a photoresist layer;
   wherein the phase shifter defines the gate within the associated transistor that includes the endcap that is susceptible to line end shortening during an optical lithography process;
   wherein the phase shifter extends beyond an associated active region of the associated transistor, so that the phase shifter defines at least a portion of the endcap and thereby reduces line end shortening of the endcap due to optical effects.

18. The mask of claim 17, wherein the phase shifter extends past the endcap.

19. The mask of claim 17, wherein the phase shifter covers at least part of the endcap, but does not extend past the endcap.

20. The mask of claim 17, wherein the phase shifter satisfies design rules that specify a minimum distance between the phase shifter and other structures within the integrated circuit.

21. The mask of claim 17, further comprising a second mask that defines binary features of the integrated circuit, wherein the second mask does not include any binary features for optical proximity correction (OPC) of the endcap.

22. The mask of claim 17, further comprising a second mask that defines binary features of the integrated circuit, wherein the second mask includes binary features for optical proximity correction (OPC) of other endcaps.

23. A semiconductor structure within an integrated circuit that is formed through a process that controls line end shortening arising from optical effects, the semiconductor structure comprising:

a first transistor including a first gate;

wherein the first gate includes an endcap that is susceptible to line end shortening during an optical lithography process;

wherein the endcap is formed by extending a phase shifter used to form the first gate beyond an associated active region, so that the phase shifter defines at least a portion of the endcap and thereby reduces line end shortening of the endcap due to optical effects.

24. The semiconductor structure of claim 23, wherein the phase shifter extends past the endcap.

25. The semiconductor structure of claim 23, wherein the phase shifter covers at least part of the endcap, but does not extend past the endcap.

26. A system for reducing line end shortening during an optical lithography process for manufacturing an integrated circuit, comprising:

a first means for receiving a specification of the integrated circuit, wherein the specification defines transistors that include gates;

a second means for identifying a gate within the specification, wherein the gate includes an endcap that is susceptible to line end shortening during the optical lithography process; and a third means for extending a phase shifter used to form the gate beyond an associated active region, so that the phase shifter defines at least a portion of the endcap and thereby reduces line end shortening of the endcap due to optical effects.

27. A method for reducing line end shortening during an optical lithography process for manufacturing an integrated circuit, comprising:

receiving a specification of the integrated circuit, wherein the specification defines transistors that include gates;

identifying a gate within the specification, wherein the gate includes an endcap that is susceptible to line end shortening during the optical lithography process; and using an extended a phase shifter to form the gate, wherein the extended phase shifter defines at least a portion of the endcap and thereby reduces line end shortening of the endcap due to optical effects.

28. A mask for use in fabricating an integrated circuit, wherein the mask includes a phase shifter that defines a gate, wherein the phase shifter extends into an endcap of an associated transistor to control line end shortening arising from optical effects, comprising:

the phase shifter within the mask that is configured to create a region of destructive light interference on a photoresist layer;

wherein the phase shifter defines the gate within the associated transistor that includes the endcap;

wherein the phase shifter defines at least a portion of the endcap and thereby reduces line end shortening of the endcap due to optical effects.

29. A method for reducing line end shortening during an optical lithography process for manufacturing an integrated circuit, comprising:

receiving a specification of the integrated circuit, wherein the specification defines transistors that include gates;

identifying a gate within the specification, wherein the gate includes an endcap that is susceptible to line end shortening during the optical lithography process;

if the endcap includes a modification for optical proximity correction, removing the modification; and extending a phase shifter used to form the gate beyond an associated active region, so that the phase shifter defines at least a portion of the endcap and thereby reduces line end shortening of the endcap due to optical effects.

30. The method of claim 29, further comprising automatically checking design rules that specify a minimum distance between the phase shifter and other structures within the integrated circuit.

31. The method of claim 29, further comprising marking the endcap to prevent subsequent optical proximity correction of the endcap.

32. The method of claim 31, further comprising applying optical proximity correction (OPC) to the specification of the integrated circuit, wherein OPC is not applied to endcaps that have been marked.

33. A method for reducing line end shortening during an optical lithography process for manufacturing an integrated circuit, comprising:

receiving a specification of the integrated circuit, wherein the specification defines transistors that include gates;

identifying a gate within the specification, wherein the gate includes an endcap that is susceptible to line end shortening during the optical lithography process;

if the endcap is not straight, replacing the endcap with a straight endcap; and extending a phase shifter used to form the gate beyond an associated active region, so that the phase shifter defines at least a portion of the endcap and thereby reduces line end shortening of the endcap due to optical effects.

34. The method of claim 33, wherein the endcap that is not straight includes one of:

a bent-line endcap;

a serif endcap;

a hammerhead endcap;

a partial hammerhead endcap; and an arrowhead endcap.

35. The method of claim 33, further comprising automatically checking design rules that specify a minimum distance between the phase shifter and other structures within the integrated circuit.

36. The method of claim 33, further comprising marking the endcap to prevent subsequent optical proximity correction of the endcap.

37. The method of claim 36, further comprising applying optical proximity correction (OPC) to the specification of the integrated circuit, wherein OPC is not applied to endcaps that have been marked.

38. A computer-readable storage medium storing instructions that when executed by a computer cause the computer to perform a method for reducing line end shortening during an optical lithography process for manufacturing an integrated circuit, the method comprising:

receiving a specification of the integrated circuit, wherein the specification defines transistors that include gates;

identifying a gate within the specification, wherein the gate includes an endcap that is susceptible to line end shortening during the optical lithography process;

if the endcap includes a modification for optical proximity correction, removing the modification; and extending a phase shifter used to form the gate beyond an associated active region, so that the phase shifter defines at least a portion of the endcap and thereby reduces line end shortening of the endcap due to optical effects.

39. The computer-readable storage medium of claim 38, wherein the method further comprises automatically checking design rules that specify a minimum distance between the phase shifter and other structures within the integrated circuit.

40. The computer-readable storage medium of claim 38, wherein the method further comprises marking the endcap to prevent subsequent optical proximity correction of the endcap.

41. The computer-readable storage medium of claim 40, wherein the method further comprises applying optical proximity correction (OPC) to the specification of the integrated circuit, wherein OPC is not applied to endcaps that have been marked.

42. A computer-readable storage medium storing instructions that when executed by a computer cause the computer to perform a method for reducing line end shortening during an optical lithography process for manufacturing an integrated circuit, the method comprising:

receiving a specification of the integrated circuit, wherein the specification defines transistors that include gates;

identifying a gate within the specification, wherein the gate includes an endcap that is susceptible to line end shortening during the optical lithography process;

if the endcap is not straight, replacing the endcap with a straight endcap; and extending a phase shifter used to form the gate beyond an associated active region, so that the phase shifter defines at least a portion of the endcap and thereby reduces line end shortening of the endcap due to optical effects.

43. The computer-readable storage medium of claim 42, wherein the endcap that is not straight includes one of:

a bent-line endcap;

a serif endcap;

a hammerhead endcap;

a partial hammerhead endcap; and an arrowhead endcap.

44. The computer-readable storage medium of claim 42, wherein the method further comprises automatically checking design rules that specify a minimum distance between the phase shifter and other structures within the integrated circuit.

45. The computer-readable storage medium of claim 42, wherein the method further comprises marking the endcap to prevent subsequent optical proximity correction of the endcap.

46. The computer-readable storage medium of claim 45, wherein the method further comprises applying optical proximity correction (OPC) to the specification of the integrated circuit, wherein OPC is not applied to endcaps that have been marked.

47. A system for reducing line end shortening during an optical lithography process for manufacturing an integrated circuit, comprising:

a first means for receiving a specification of the integrated circuit, wherein the specification defines transistors that include gates;

a second means for identifying a gate within the specification, wherein the gate includes an endcap that is susceptible to line end shortening during the optical lithography process;

a third means for removing existing optical proximity correction from the endcap; and a fourth means for extending a phase shifter used to form the gate beyond an associated active region, so that the phase shifter defines at least a portion of the endcap and thereby reduces line end shortening of the endcap due to optical effects.

48. A system for reducing line end shortening during an optical lithography process for manufacturing an integrated circuit, comprising:

a first means for receiving a specification of the integrated circuit, wherein the specification defines transistors that include gates;

a second means for identifying a gate within the specification, wherein the gate includes an endcap that is susceptible to line end shortening during the optical lithography process;

a third means for replacing a non-straight endcap with a straight endcap; and a fourth means for extending a phase shifter used to form the gate beyond an associated active region, so that the phase shifter defines at least a portion of the endcap and thereby reduces line end shortening of the endcap due to optical effects.

49. A method for alleviating line end shortening on a transistor gate in a layout having optical proximity corrections, the method comprising:

identifying the transistor gate in the layout, the transistor gate comprising an active region and an endcap;

determining if the endcap includes an optical proximity correction; and if the endcap includes the optical proximity correction:
removing the optical proximity correction, placing an at least one phase shifter in the layout to define the active region and at least a portion of the endcap, wherein placement of the at least one phase shifter reduces line end shortening of the endcap due to optical effects of an optical lithograph process.

50. The method of claim 49, further comprising automatically checking design rules that specify a minimum distance between the at least one phase shifter and other structures within the layout.

51. The method of claim 49, further comprising marking the endcap to prevent subsequent optical proximity correction of the endcap.

52. The method of claim 51, further comprising applying optical proximity correction (OPC) to a specification of the layout, wherein OPC is not applied to endcaps that have been marked.

53. An apparatus for alleviating line end shortening during an optical lithography process for manufacturing an integrated circuit through removal of extant optical proximity corrections on transistor gate endcaps, the apparatus comprising:

means for identifying a transistor gate in a layout wherein the transistor gate comprises an active area and an endcap, the active area defined using an at least one phase shifter and the endcap including an at least one optical proximity correction;

means for modifying the endcap to remove the at least one optical proximity correction; and means for extending the at least one phase shifter to define at least a portion of the endcap.

54. The apparatus of claim 53, further comprising means for automatically checking design rules that specify a minimum distance between the at least one phase shifter and other structures within the layout.

55. The apparatus of claim 53, further comprising means for marking the endcap to prevent subsequent optical proximity correction of the endcap.

56. The apparatus of claim 55, further comprising means for applying optical proximity correction (OPC) to a specification of the layout, wherein OPC is not applied to endcaps that have been marked.

* * * * *